US011769567B2

(12) United States Patent
Refaeli et al.

(10) Patent No.: US 11,769,567 B2
(45) Date of Patent: Sep. 26, 2023

(54) DEVICES AND METHODS FOR PREVENTING ERRORS AND DETECTING FAULTS WITHIN A MEMORY DEVICE

(71) Applicant: NXP USA, Inc., Austin, TX (US)

(72) Inventors: Jehoda Refaeli, Austin, TX (US); Glenn Charles Abeln, Buda, TX (US); Jorge Arturo Corso Sarmiento, Austin, TX (US)

(73) Assignee: NXP USA, Inc., Austin, TX (US)

( * ) Notice: Subject to any disclaimer, the term of this patent is extended or adjusted under 35 U.S.C. 154(b) by 91 days.

(21) Appl. No.: 17/379,213

(22) Filed: Jul. 19, 2021

(65) Prior Publication Data

US 2023/0015944 A1 Jan. 19, 2023

(51) Int. Cl.
| | |
|---|---|
| *G11C 29/42* | (2006.01) |
| *G11C 29/18* | (2006.01) |
| *G11C 7/10* | (2006.01) |
| *H03K 19/017* | (2006.01) |
| *G11C 29/12* | (2006.01) |

(52) U.S. Cl.
CPC .............. *G11C 29/42* (2013.01); *G11C 7/106* (2013.01); *G11C 7/1087* (2013.01); *G11C 29/18* (2013.01); *H03K 19/01721* (2013.01); *G11C 2029/1202* (2013.01); *G11C 2029/1802* (2013.01)

(58) Field of Classification Search
CPC ....... G11C 29/42; G11C 7/106; G11C 7/1087; G11C 29/18; G11C 2029/1202; G11C 2029/1802; H03K 19/01721

USPC ..................................................... 365/185.09
See application file for complete search history.

(56) References Cited

U.S. PATENT DOCUMENTS

| | | | |
|---|---|---|---|
| 10,553,300 B2 | 2/2020 | Fujiwara et al. | |
| 2016/0004596 A1* | 1/2016 | D'Abreu | G06F 11/108 |
| | | | 714/773 |
| 2020/0110659 A1* | 4/2020 | Foley | G06F 11/1076 |
| 2021/0124659 A1* | 4/2021 | Ryu | G06F 12/0238 |

FOREIGN PATENT DOCUMENTS

DE         102009001352 A1    9/2010

* cited by examiner

*Primary Examiner* — Hoai V Ho
*Assistant Examiner* — Minh Dinh

(57) ABSTRACT

A data processing system includes a memory configured to receive memory access requests. Each memory access request having a corresponding access address and having a corresponding parity bit for an address value of the corresponding access address. The corresponding access address is received over a plurality of address lines and the parity bit is received over a parity line. The memory includes a memory array having a plurality of memory cells arranged in rows, each row having a corresponding word line of a plurality of word lines, and a row decoder coupled to the plurality of address lines, the parity line, and the plurality of word lines. The row decoder is configured to selectively activate a selected word line of the plurality of word lines based on the corresponding access address and the corresponding parity bit of a received memory access request. The concept can also be used with parity bits on columns of the memory cells and a column decoder that selects bit lines associated with column address lines.

19 Claims, 2 Drawing Sheets

DEVICES AND METHODS FOR PREVENTING ERRORS AND DETECTING FAULTS WITHIN A MEMORY DEVICE

BACKGROUND

Field

This disclosure relates generally to memory devices, and more specifically, to preventing errors and detecting faults within a memory device.

Related Art

In volatile and non-volatile memory devices, rows and columns of memory cells are interconnected to each other to form a memory cell array. Wordlines are connected to rows of the memory cells within a memory cell array. Bit lines are connected to columns of the memory cells within a memory cell array. Wordlines and bit lines are used to read from and write to selected memory cells using a specific wordline and rowline to access a particular memory address.

As microprocessor and microcontroller units (MCU/MPUs) are increasingly used in equipment, they may be required to meet certain safety standards, such as those found in Functional Safety Standard ISO 26262 for Automotive Electric/Electronic Systems. The MCU/MPUs typically include volatile and non-volatile memories devices. Error correction codes (ECC) have been the primary method to protect data content from being corrupted. ECC has evolved since to include some address decoder failure detection, but the detection is incomplete and may fail to detect errors. A certain class of failure is due to incorrect address selection during match or no match.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed that add logic to a memory decoder to help detect and prevent faults in row decoders in memory devices. Errors that can be detected include incorrect row selection due to decoder error, unintentional row selection due to a soft error in the row regardless of the decoders, and no row select events. An address select bus is connected to row and column decoders that are coupled to an array of memory cells. The decoders decode incoming addresses and assert the corresponding row and column lines of the corresponding memory cell when a clock signal is high. A parity bit is added along with the address bits used in the row decoders. If parity does not match the address, the row line is prevented from asserting. Parity error report logic can be included to report these events. An indicator circuit, such as a single pull down NMOS transistor, for example, and a corresponding decoder can be added to indicate the memory cell affected. The output of the indicator circuit can be shared by other decoders in the memory device. A sense amplifier with a shared pull device can detect the case when a decoder cell has a decode error.

Figure 1:
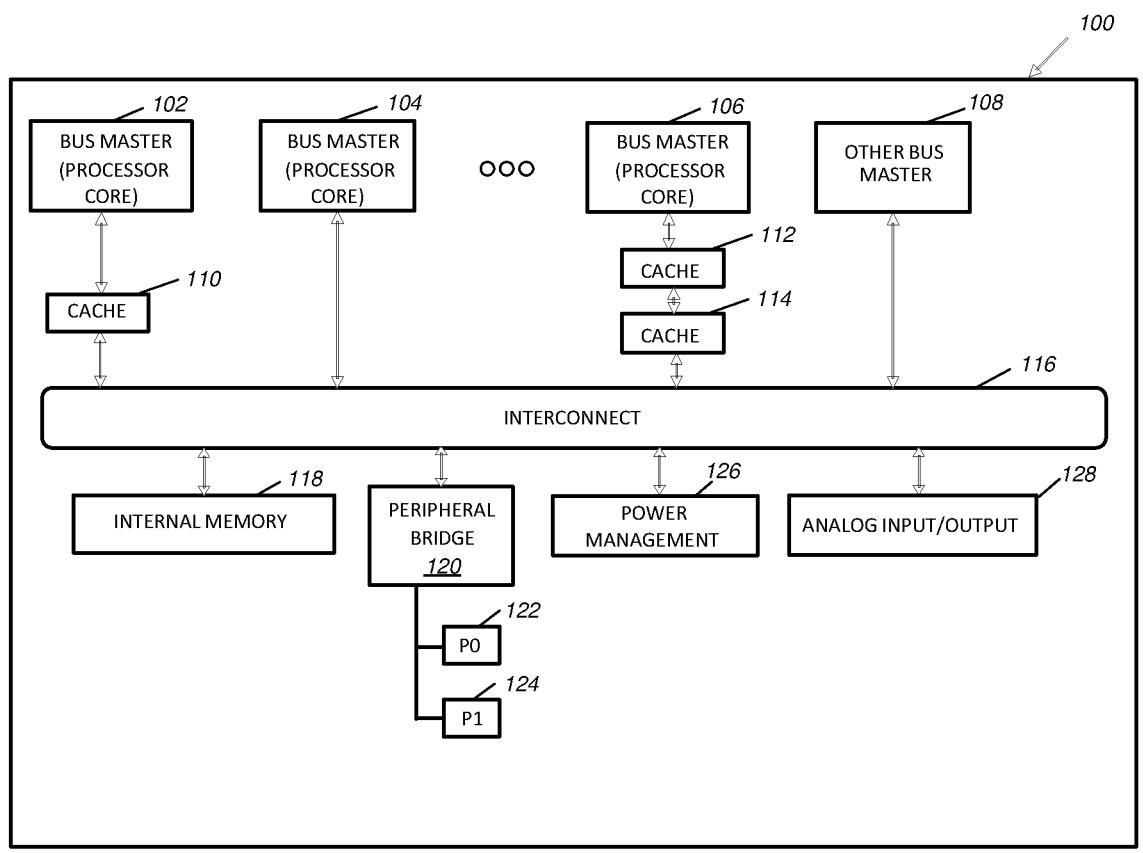
FIG. 1 illustrates an embodiment of a processing system in accordance with the present invention.

FIG. 1 illustrates a simplified block diagram of components of processing system (also referred to as an integrated circuit) 100 capable of detecting faults in row decoders in internal memory device 115 in accordance with selected embodiments of the present invention. Processing system 100 can include one or more bus masters in the form of processor cores 102, 104, 106, other bus masters 108 such as direct memory access controllers, one or more levels of cache memory 110, 112, 114 associated with one or more of the processor cores 102, 104, 106, interconnect 116, internal memory device 118, peripheral bridge 120 coupled to peripherals 122, 124, power management circuit 126, analog I/O circuitry 128, and other components such as network ports (not shown).

Processing cores 102, 104, 106 include computer processor circuitry capable of performing functions that may be implemented as software instructions, hardware circuitry, firmware, or a combination of software, hardware and/or firmware. Operations and functions may be performed under the control of an operating system. One or more instances of software application code may be executed at the same time. Application code being executed by processing cores 102, 104, 106 may access data and instructions in memory device 118 via interconnect 116. Processing cores 102, 104, 106 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. In addition or in the alternative, processing cores 102, 104, 106 may be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, or an embedded processor. Any other type of bus master logic 108, such as a direct memory access controller, capable of initiating or responding to requests, may also be included in processing system 100.

Processing system 100 can also include one or more network ports (not shown) configurable to connect to one or more networks, which may likewise accessible to one or more remote nodes. The remote nodes can include other applications processors, devices or sensors that can exchange information with processing system 100.

Interconnect 116 routes requests and responses between bus masters 102, 104, 106, 108 and power management circuit 126, peripheral bridge 120, one or more internal memory devices 118, and analog I/O circuitry 128.

Peripheral bridge 120 is communicatively coupled to interconnect 116. Peripheral bridge 120 can include, for example, circuitry to perform power management, flash management, interconnect management, USB, and other PHY type tasks. A variety of peripheral devices 122,124 such as sensors, field programmable gate arrays, external integrated circuits, a mouse, keyboard, printer, display monitor, external memory drives, cameras, and lights, among others, can be coupled to processing system 100 via peripheral bridge 120.

Cache memory devices 110-114 are typically implemented using random-access memory (RAM) and can be used to hold instructions and data that are frequently accessed by a corresponding bus master 102-108. Information that is no longer used or less frequently used may be swapped out for information that has become more frequently accessed. Cache memory devices 110-114 can have different levels from each other. For example, cache memory devices 110 and 112 can be level one cache, and cache memory device 114 can be a level two cache. Other levels of cache memory can be included. Level one cache is typically faster and smaller in size than level two or three cache.

Internal memory device 118 may include one or more volatile storage (or memory) devices such as random-access memory (RAM), dynamic RAM (DRAM), synchronous DRAM (SDRAM), static RAM (SRAM), or other types of volatile storage devices. In addition or in the alternative, internal memory device 118 may include non-volatile memory, such as read only memory (ROM), electrically erasable programmable ROM, flash memory, magnetic RAM, resistive RAM, write once memory such as fuses, or the like. Additionally, tightly coupled memory may be connected directly to bus masters 102-108 with no connection to interconnect 116, or be connected between a respective one of bus masters 102-108 and interconnect 116, similar to cache memory devices 110-114. In whatever form, internal memory device 118 may store information including sequences of instructions that are executed by the processing device or any other device, information to configure processing system 100, and other data, instructions or information. For example, executable code and/or data, including but not limited to an operating system, device drivers, firmware (e.g., input output basic system or BIOS), and/or applications can be loaded in the memory and executed by processor cores 102, 104, 106.

Power management circuit 126 can include a processor core and can send and receive signals to control various operating power modes for bus masters 102-108, cache memory 110-114, internal memory 118, analog input/output (I/O) circuitry 128, and peripheral components 122, 124 through peripheral bridge 120. The power modes may include normal operation, sleep, or other power saving modes, and power down, as well as to supply proper levels of voltage to various components in processing system 100.

Analog I/O circuitry 128 can include various components such as power regulators, analog-to-digital converters, reference voltage circuits, input/output buffers and other circuits with electrostatic discharge protection, and fault detection circuit 130. Other suitable components may be included in analog and input/output circuitry 128.

Figure 2:
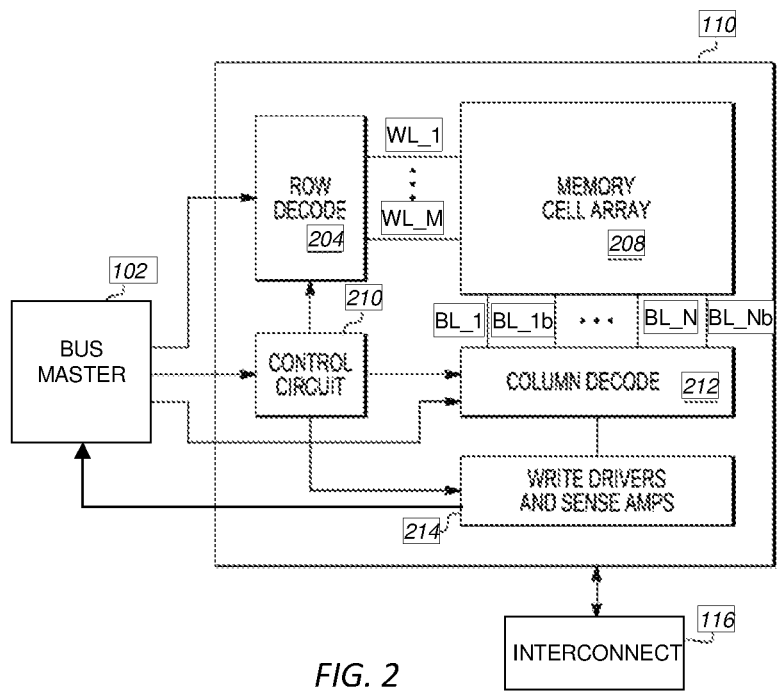
FIG. 2 illustrates further detail of an embodiment of a memory device that can be included in the processing system of FIG. 1.

Referring to FIGS. 1 and 2, FIG. 2 illustrates an embodiment of cache memory 110 that can include logic circuitry to help detect and prevent faults in row decode circuit 204. Although cache memory device 110 is used to illustrate embodiments of the invention, embodiments of the invention can be included in other suitable types of memory devices, such as memory devices in internal memory 118, that use row decode circuit 204. As shown, cache memory device 110 is coupled to bus master 102 and interconnect 116 and includes row decode circuit 204, memory cell array 208, control circuit 210, column decode circuit 212, and write drivers and sense amplifiers 214. Control circuit 210 is coupled to row decode circuit 204 and column decode circuit 212 via address lines. Bus master 102 is also coupled to control circuit 210 of memory device 102 via control lines. In addition, cache memory device 110 is coupled to interconnect 116 via input/output lines.

Cache memory device 110 includes write drivers and sense amplifiers 214 coupled to receive control signals from control circuit 210 and provide information from memory cell array 208 to bus master 102. Cache memory device 110 can also receive information from internal memory 118 to help to speed access to information stored in memory device 110 by bus master 102 instead of incurring the overhead required to access the information from internal memory device 118 through interconnect 116.

Memory cell array 208 is implemented in rows and columns and may include any suitable number of rows and columns of memory cells. Memory cell array 208 includes a number of wordlines (i.e., WL_1 through WL_M) coupled to row decode circuit 204 and a number of bit line pairs (i.e., BL_1 through BL_n and BL_1$b$ through BL_Nb) coupled to column decode circuit 212. Along with write drivers and sense amplifiers 214, memory cell array 208 is constructed to use a memory cell sensing scheme such that each bit line pair is used in reading and writing data into memory cell array 208. Word lines WL_1 . . . WL_M are connected to a respective row of memory cells. Bit lines BL_1, BL_1$b$ . . . BL_N, BL_Nb are connected to a respective column of memory cells. Note that a letter "b" after the bit line designator indicates that the signal name is a logical complement of a signal having the same name but lacking the "b". For example, the signal labeled "BL_1$b$" is the logical complement of the signal labeled "BL_1".

Row decode circuit 204 receives a row address that is used to select one row of memory cell array 208 for read or write operations. Power supply voltage VDD is also provided to row decode circuit 204 and is conducted on word lines WL_1 to WL_N. VDD can be any suitable voltage, such as, for example, one volt. Power supply voltage VSS can be ground. In other embodiments, the power supply voltages may be different. For example, VDD may be ground and VSS may be a negative voltage. A write/read signal is provided to row decode circuit 204 by control circuit 210. The write/read signal indicates whether a write or a read operation is being performed.

Column decode circuit 212 receives a column address from bus master 102, and is coupled to bit line pairs BL_1/BL_16 . . . BL_N/BL_NB, and a plurality of input/output (I/O) terminals for receiving or providing data signals from write driver circuits. Column decode circuit 212, along with row decode circuit 204, select which of the memory cells in memory cell array 208 are to receive or provide data based on the address information provided by bus master 102.

Figure 3:
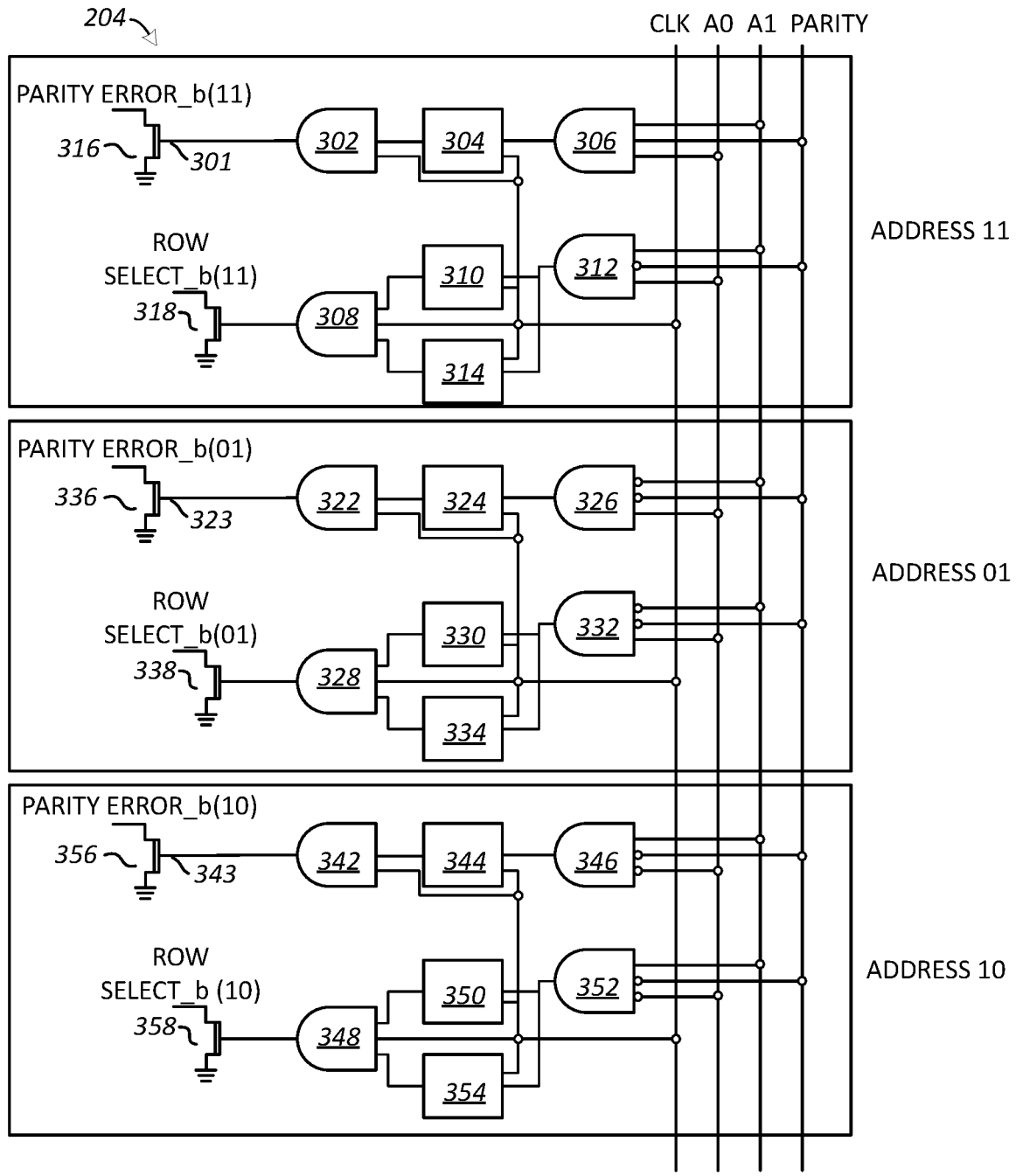
FIG. 3 illustrates further detail of an embodiment of the row decoder of the memory device of FIG. 2.

FIG. 3 illustrates further detail of an embodiment of row decode circuit 204 of cache memory device 110 of FIG. 2. In the example shown, there are three rows that correspond to addresses that include two bits A0 and A1, including row ADDRESS 11, row ADDRESS 01, and row ADDRESS 10. Each address row includes address decode circuitry, parity error detection circuitry, and row selected circuitry.

For the row corresponding to ADDRESS 11, the parity error detection circuitry includes AND gates 306, 302, latch circuit 304, and PARITY_ERROR_b indicator circuit 316. AND gate 306 includes a first input coupled to address bit A1, a second input coupled to a parity bit, and a third input coupled to address bit A0. Latch circuit 304 includes a data input coupled to the output of AND gate 306, and a clock input coupled to a memory clock signal CLK. AND gate 302 includes a first input coupled to an output of latch circuit 304 and a second input coupled to the memory clock signal CLK. PARITY_ERROR_b indicator circuit 316 is shown as an NMOS transistor with a gate electrode coupled to an output of AND gate 302, a source electrode coupled to ground, and a drain electrode coupled to a supply voltage (not shown) greater than the ground voltage.

For the row corresponding to ADDRESS 01, the parity error detection circuitry includes AND gates 326, 322, latch circuit 324, and PARITY_ERROR_b indicator circuit 336. AND gate 326 includes a first inverting input coupled to address bit A1, a second inverting input coupled to the parity bit, and a third input coupled to address bit A0. Latch circuit 324 includes a data input coupled to the output of AND gate 326, and a clock input coupled to memory clock signal CLK. AND gate 322 includes a first input coupled to an output of latch circuit 324 and a second input coupled to the memory clock signal CLK. PARITY_ERROR_b indicator circuit 336 is shown as an NMOS transistor with a gate electrode coupled to an output of AND gate 322, a source electrode coupled to ground, and a drain electrode coupled to a supply voltage (not shown) greater than the ground voltage.

For the row corresponding to ADDRESS 10, the parity error detection circuitry includes AND gates 346, 342, latch circuit 344, and PARITY_ERROR_b indicator circuit 356. AND gate 346 includes a first input coupled to address bit A1, a second inverting input coupled to the parity bit, and a third inverting input coupled to address bit A0. Latch circuit 344 includes a data input coupled to the output of AND gate 346, and a clock input coupled to memory clock signal CLK. AND gate 342 includes a first input coupled to an output of latch circuit 344 and a second input coupled to the memory clock signal CLK. PARITY_ERROR_b indicator circuit 356 is shown as an NMOS transistor with a gate electrode coupled to an output of AND gate 342, a source electrode coupled to ground, and a drain electrode coupled to a supply voltage (not shown) greater than the ground voltage.

The parity bit is added to the address bits to help detect whether there is an error in the address by determining whether the number of bits set to a value of "1" in the string is even or odd. When even parity is being used, if the number of bits in a set of bits whose value is 1 is odd, the parity bit value is set to 1, making the total count of occurrences of 1s in the whole set (including the parity bit) an even number. If the count of 1s in a given set of bits is already even, the parity bit's value is 0. In the case of odd parity, the coding is reversed. For a given set of bits, if the count of bits with a value of 1 is even, the parity bit value is set to 1 making the total count of 1s in the whole set (including the parity bit) an odd number. If the count of bits with a value of 1 is odd, the count is already odd so the parity bit's value is 0. The example of row decode circuit 204 shown in FIG. 3 uses even parity, but it is anticipated that different logic elements may be used to implement odd parity in row decode circuit 204.

An address decodes to a certain row line selection at the input to cache memory 110. Row decode circuit 204 decodes an address and asserts the row line when all bits of the address match the row when a clock signal CLK is HIGH. The parity bit is added along with the address bits used in row decode circuit 204. If parity doesn't match the address, the row line can be prevented from asserting. A parity error report logic including AND gates 302, 306, 322, 326, 342, 346, latch circuits 304, 324, 344, and indicator circuits 316, 336, 356 have been added to report parity errors in the address bits. A single pull down NMOS and related decode is added.

To detect whether there is a parity error for an address during operation for the example shown in FIG. 3, each row receives the row address on address lines A0 and A1 along with a parity bit for the address. The clock signal is asserted when a row is going to be accessed, that is, data is read from or written to an address. For the row corresponding to ADDRESS 11, if address bits A0 and A1 are both "1" with even parity being used, the parity bit will have a value of "0". The output of AND gate 306 will be LOW since the parity bit will have a value of "0" and the address bits A0 and A1 will together have a value of "11". Latch circuit 304 will store a value of "0". When clock signal CLK goes HIGH or has a value of "1" and the output of latch circuit 304 to a first input of AND gate 302 will be "0" while the clock signal CLK will be HIGH at a second input to AND gate 302. The output of AND gate 302 will thus be LOW. With the input to PARITY_ERROR_b(11) indicator circuit 316 LOW, the PARITY_ERROR_b(11) signal will be HIGH, indicating no parity error on the address bits as supply voltage at the drain electrode remains HIGH. If a parity error is detected, the PARITY_ERROR_b(11) signal will be LOW since PARITY_ERROR_b(11) indicator circuit 316 will be in conductive mode and pull the voltage at the source electrode to ground. The status of the PARITY_ERROR_b(11) indicator circuit 316 can be reported and corrective action, such as preventing the row line from asserting, or other suitable action, can be taken if needed.

For the row corresponding to ADDRESS 01, address bits A0 and A1 should be "0" and "1", respectively. With even parity being used, the parity bit will have a value of "1". Due to the inverting inputs for bit A1 and the parity bit, the output of AND gate 326 will be LOW since the input for parity bit will be inverted to have a value of "0" and the inputs for address bits A0 and A1 will together have a value of "00". When clock signal CLK goes HIGH or has a value of "1", the output of latch circuit 324 provided to a first input of AND gate 322 will be "0" while the clock signal CLK will be HIGH at a second input to AND gate 322. The output of AND gate 322 will thus be LOW. With the input to PARITY_ERROR_b(01) indicator circuit 336 LOW, the PARITY_ERROR_b(01) signal will be HIGH, indicating no parity error on the address bits as supply voltage at the drain electrode remains HIGH. If, however, either A0 has a value of "1" or A1 has a value of "0", NMOS transistor 336 will be in conductive mode and pull the voltage at the source electrode to ground. The PARITY_ERROR_b(01) signal will be LOW, indicating a parity error in the address bits A0 and A1 for row ADDRESS 01. The status of the PARITY_ERROR_b(01) indicator circuit 336 can be reported and corrective action, such as preventing the row line from asserting, or other suitable action, can be taken.

For the row corresponding to ADDRESS 10, if address bits A0 and A1 are "1" and "0", respectively, with even parity being used, the parity bit will have a value of "1". The output of AND gate 346 will be LOW since the parity bit will have a value of "0" and the inputs for address bits A0 and A1 will together have a value of "00" at AND gate 326 due to the inverting inputs for bit A0 and the parity bit. When clock signal CLK goes HIGH or has a value of "1", the output of latch circuit 344 provided to a first input of AND gate 342 will be "0" while the clock signal CLK will be HIGH at a second input to AND gate 342. The output of AND gate 342 will thus be LOW. With the input to PARITY_ERROR_b(10) indicator circuit LOW, the PARITY_ERROR_b(10) signal will be HIGH, indicating no parity error on the address bits as supply voltage at the drain electrode remains HIGH. If, however, either A0 has a value of "0" or A1 has a value of "1", The output of AND gate 348 will be HIGH, causing the NMOS transistor to be in conductive mode and pull the voltage at the source electrode to ground. The PARITY_ERROR_b(10) signal will be LOW, indicating an error in the address bits A0 and A1 for row ADDRESS 10. The status of the PARITY_ERROR_b (10) indicator circuit 356 can be reported and corrective action, such as preventing the row line from asserting, or other suitable action, can be taken.

Another fault that can happen in row decode circuit 204 is incorrectly selecting a row when a latch circuit incorrectly asserts or is stuck HIGH for an amount of time greater than expected. To help detect this row select fault, each row includes two latch circuits 310, 314, 326, 332, 346, 352 to detect incorrect activation of the row lines. If only one latch circuit asserts, the row line will not be selected. Row select detection circuits 318, 338, 358 are placed at the end of each corresponding row line to provide an indicator of whether or not a row was correctly selected.

The row select detection circuitry for row ADDRESS 11 includes AND gates 312 and 308, latch circuits 310, 314, and ROW_SELECTED_B(11) detection circuit 318. AND gate 312 includes a first input coupled to address bit A1, a second inverting input coupled to the parity bit, and a third input coupled to address bit A0. Latch circuit 310 includes a data input coupled to the output of AND gate 312, and a clock input coupled to the memory clock signal CLK. Latch circuit 314 includes a data input coupled to the output of AND gate 312, and a clock input coupled to the memory clock signal CLK. AND gate 308 includes a first input coupled to an output of latch circuit 310, a second input coupled to the memory clock signal CLK, and a third input coupled to an output of latch circuit 314. ROW_SELECTED_B(11) detection circuit 318 is shown as an NMOS transistor with a control electrode coupled to an output of AND gate 308, a source electrode coupled to ground, and a drain electrode coupled to a supply voltage (not shown) greater than the ground voltage.

For the row corresponding to ADDRESS 11, if address bits A0 and A1 are both "1" with even parity being used, the parity bit will have a value of "0". The output of AND gate 312 will be HIGH since the parity bit will inverted to have a value of "1" and the address bits A0 and A1 will together have a value of "11". Latch circuits 310, 314 will store a value of "1" when the clock signal CLK goes HIGH. If both latch circuits are operating correctly, the output of latch circuits 310, 314 to first and second inputs of AND gate 308 will be "11" while the clock signal CLK will be HIGH at a third input to AND gate 308. The output of AND gate 308 will thus be HIGH. With the input to ROW_SELECT_b(11) indicator circuit 318 HIGH, the ROW_SELECT_b(11) signal will be LOW, indicating no row select error as supply voltage at the drain electrode is LOW. If one of latch circuits 310, 314 retains a value of zero, does not respond to the clock signal, or there is a row line fault, the ROW_SELECT_b(11) signal will be HIGH since the output of AND gate 308 will be LOW and ROW_SELECT_b(11) indicator circuit 318 will not be in conductive mode. The status of the ROW_SELECT_b(11) indicator circuit 318 can be reported and corrective action, such as preventing the row line from asserting, or other suitable action, can be taken if needed.

The row select detection circuitry for row ADDRESS 01 includes AND gates 332 and 328, latch circuits 330, 334, and ROW_SELECTED_B(01) detection circuit 338. AND gate 332 includes a first inverting input coupled to address bit A1, a second inverting input coupled to the parity bit, and a third input coupled to address bit A0. Latch circuit 330 includes a data input coupled to the output of AND gate 332, and a clock input coupled to the memory clock signal CLK. Latch circuit 334 includes a data input coupled to the output of AND gate 332, and a clock input coupled to the memory clock signal CLK. AND gate 338 includes a first input coupled to an output of latch circuit 330, a second input coupled to the memory clock signal CLK, and a third input coupled to an output of latch circuit 334. ROW_SELECTED_B(11) detection circuit 338 is shown as an NMOS transistor with a control electrode coupled to an output of AND gate 338, a source electrode coupled to ground, and a drain electrode coupled to a supply voltage (not shown) greater than the ground voltage.

For the row corresponding to ADDRESS 01, the first input to AND gate 332 for address bit A0 has a value of "1" due to the inverting input, and address bit A1 also has a value of "1". With even parity, the input for the parity bit will have a value of "1" due to the inverting input to AND gate 332. The output of AND gate 332 will be HIGH since the parity bit will inverted to have a value of "1" and the address bits A0 and A1 will together have a value of "11". Latch circuits 330, 334 will store a value of "1" when the clock signal CLK goes HIGH. If both latch circuits 330, 334 are operating correctly, the output of latch circuits 330, 334 to first and second inputs of AND gate 328 will be "11" while the clock signal CLK will be HIGH at a third input to AND gate 328. The output of AND gate 328 will thus be HIGH. With the input to ROW_SELECT_b(01) indicator circuit 338 HIGH, the ROW_SELECT_b(01) signal will be LOW, indicating no row select error as supply voltage at the drain electrode is LOW. If one of latch circuits 330, 334 retains a value of zero, does not respond to the clock signal, or there is a row line fault, the ROW_SELECT_b(01) signal will be HIGH since the output of AND gate 328 will be LOW and ROW_SELECT_b(01) indicator circuit 338 will not be in conductive mode. The status of the ROW_SELECT_b(01) indicator circuit 338 can be reported and corrective action, such as preventing the row line from asserting, or other suitable action, can be taken if needed.

The row select detection circuitry for row ADDRESS 10 includes AND gates 352 and 348, latch circuits 350, 354, and ROW_SELECTED_B(10) detection circuit 358. AND gate 352 includes a first input coupled to address bit A1, a second inverting input coupled to the parity bit, and a third inverting input coupled to address bit A0. Latch circuit 350 includes a data input coupled to the output of AND gate 352, and a clock input coupled to the memory clock signal CLK. Latch circuit 354 includes a data input coupled to the output of AND gate 352, and a clock input coupled to the memory clock signal CLK. AND gate 348 includes a first input coupled to an output of latch circuit 344, a second input coupled to the memory clock signal CLK, and a third input coupled to an output of latch circuit 354. ROW_SELECTED_B(10) detection circuit 358 is shown as an NMOS transistor with a control electrode coupled to an output of AND gate 348, a source electrode coupled to ground, and a drain electrode coupled to a supply voltage (not shown) greater than the ground voltage.

For the row corresponding to ADDRESS 10, the first input to AND gate 352 for address bit A0 has a value of "1" due to the inverting input, and address bit A1 also has a value of "1". With even parity, the input for the parity bit will have a value of "1". The output of AND gate 352 will be HIGH since the parity bit will inverted to have a value of "1" and the address bits A0 and A1 will together have a value of "11". Latch circuits 350, 354 will store a value of "1" when the clock signal CLK goes HIGH. If both latch circuits 350, 354 are operating correctly, the output of latch circuits 350, 354 to first and second inputs of AND gate 348 will be "11"

while the clock signal CLK will be HIGH at a third input to AND gate 348. The output of AND gate 348 will thus be HIGH. With the input to ROW_SELECT_b(10) indicator circuit 338 HIGH, the ROW_SELECT_b(10) signal will be LOW, indicating no row select error as supply voltage at the drain electrode is LOW. If one of latch circuits 35, 354 retains a value of zero, does not respond to the clock signal, or there is a row line fault, the ROW_SELECT_b(10) signal will be HIGH since the output of AND gate 348 will be LOW and ROW_SELECT_b(10) indicator circuit 358 will not be in conductive mode. The status of the ROW_SE-LECT_b(10) indicator circuit 358 can be reported and corrective action, such as preventing the row line from asserting, or other suitable action, can be taken if needed.

By now it should be appreciated that in some embodiments there has been provided a data processing system that can comprise a memory (118) configured to receive memory access requests, each memory access request having a corresponding access address and having a corresponding parity bit for an address value of the corresponding access address, wherein the corresponding access address is received over a plurality of address lines (e.g. A0, A1) and the parity bit is received over a parity line (e.g. PARITY). The memory can have a memory array (208) having a plurality of memory cells arranged in rows, each row having a corresponding word line of a plurality of word lines (output of 308, 348, 348, etc.), and a row decoder (204) coupled to the plurality of address lines, the parity line, and the plurality of word lines, and configured to selectively activate a selected word line of the plurality of word lines based on the corresponding access address and the corresponding parity bit of a received memory access request (e.g. done using 312, 352, 352).

In another aspect, the row decoder can be configured to activate the selected word line when the corresponding access address selects the selected word line and the corresponding parity bit correctly provides parity for the address value of the corresponding access address, and not activate the selected word line when the corresponding parity bit incorrectly provides the parity for the address value of the corresponding access address.

In another aspect, the memory can further comprise parity error circuitry (e.g. 316, 302, 344, 306, 336, 342, etc.) coupled to the plurality of address lines and the parity line, and configured to provide a parity error indicator which indicates if the address value of the corresponding access address has a parity error or not.

In another aspect, for each row, the parity error circuitry can comprise a corresponding pull-down transistor (e.g. 316, 336, etc.), and corresponding parity error logic (e.g. 302-306, 342-326, etc.) coupled to the plurality of address lines and the parity line and having an output coupled to a control electrode of the corresponding pull-down transistor, wherein the corresponding parity error logic is configured to activate the corresponding pull-down transistor when a parity error exists for a memory access to the row, and not activate the pull-down transistor when parity is correct for the memory access to the row.

In another aspect, for each row, the corresponding parity error logic can be configured to determine whether or not the parity error exists by using the values on the plurality of address lines and the parity line provided for the memory access to the row.

In another aspect, the pull-down transistors for the plurality of rows can be coupled in parallel, such that when the pull-down transistor for at least one row of the plurality of rows is activated, the parity error circuitry indicates the parity error.

In another aspect, for each row, the row decoder can comprise corresponding decoder logic (e.g. 312, 352, 352, etc.) coupled to the plurality of address lines and the parity line and configured to provide a select indicator, wherein the select indicator is asserted when an access address addresses the row and a parity bit corresponding to the access address indicates correct parity for an address value of the access address, and a corresponding first latch (e.g. 310, 350, 350) coupled to the corresponding decoder logic to latch the select indicator, wherein the corresponding word line of the row can be activated when at least the latched select indicator is asserted.

In another aspect, for each row, the row decoder can further comprise a corresponding second latch coupled to the corresponding decoder logic to latch the select indicator, wherein the corresponding word line of the row is activated when the select indicator is asserted and values latched by the first and second latch match.

In another aspect, for each row, the row decoder can comprise a corresponding pull-down transistor having a current electrode coupled to the corresponding word line of the row, wherein the row decoder can be configured to activate the pull-down transistor when the corresponding word line of the row is activated. The corresponding pull-down transistors can be coupled in parallel to a pre-charged output node (rowselect_b), wherein when at least one word line is activated for a memory access to the memory, the output node is discharged by at least one corresponding pull-down transistor, and when no word lines are activated for the memory access, the output node remains charged to indicate an error in which no word line is selected in response to the memory access.

In another aspect, the row decoder can comprise a plurality of pull-down transistors (e.g. 318, 338, 358), wherein a control electrode of each pull-down transistors is coupled to a corresponding word line of the plurality of word lines, and a pull-down transistor of the plurality of pull-down transistors is activated when the corresponding word line is activated.

In another aspect, the plurality of pull-down transistors can be coupled in parallel between an output node (rowselect_b) and ground, wherein when at least one word line is activated for a memory access to the memory, the output node is pulled to ground to indicate that at least one word line is activated, and when no word lines are activated for the memory access, the output node is not pulled to ground to indicate an error in which no word line is selected in response to the memory access.

In another aspect, the data processing system can further comprise a system interconnect, and an initiator configured to provide memory access requests to the memory via the system interconnect.

In further embodiments, an a memory, a method can comprise receiving an access address for a memory access and a corresponding parity bit for an address value of the access address, wherein the access address indicates a selected word line of the memory; and activating the selected word line when the corresponding parity bit indicates correct parity for the address value of the access address but not activating the selected word line when the corresponding parity bit indicates incorrect parity for the address value of the access address.

In another aspect, the method can further comprise providing an error indicator if no word lines of the memory are activated in response to receiving the access address.

In another aspect, the method can further comprise providing a parity error if the corresponding parity bit indicates incorrect parity for the address value of the access address.

In still further embodiments, a data processing system can comprise a memory (118) configured to receive memory access requests, each memory access request having a corresponding access address and having a corresponding parity bit for an address value of the corresponding access address, wherein the corresponding access address is received over a plurality of address lines (e.g. A0, A1) and the parity bit is received over a parity line (e.g. PARITY). The memory can have a memory array (208) having a plurality of memory cells arranged in rows, each row having a corresponding word line of a plurality of word lines (output of 308, 348, 348, etc.); and a row decoder (204) coupled to the plurality of address lines, the parity line, and the plurality of word lines, and configured to selectively activate a selected word line of the plurality of word lines based on the corresponding access address and the corresponding parity bit of a received memory access request (e.g. done using 312, 352, 352). For each row, the row decoder includes corresponding parity error logic configured to determine whether or not a parity error exists based on the values on the plurality of address lines and the parity line provided for a memory access to the row.

In another aspect, for each row, the row decoder can further comprise a first corresponding pull-down transistor (e.g. 316, 336, etc.), wherein the corresponding parity error logic (e.g. 302-306, 342-326, etc.) has an output coupled to a control electrode of the first corresponding pull-down transistor, wherein the corresponding parity error logic is configured to activate the corresponding pull-down transistor when the parity error exists for the memory access to the row, and not active the pull-down transistor when parity is correct for the memory access to the row; and a second corresponding pull-down transistor (e.g. 318, 338, 358), wherein a control electrode of the second corresponding pull-down transistor is coupled to the corresponding word line of the row, wherein the second corresponding pull-down transistor is activated when the corresponding word line of the row is activated for the memory access.

In another aspect, the second corresponding pull-down transistors are coupled in parallel to a pre-charged output node (rowselect_b), wherein when at least one word line is activated for the memory access, the output node is discharged by at least one corresponding pull-down transistor, and when no word lines are activated for the memory access, the output node remains charged to indicate an error in which no word line is selected in response to the memory access.

In another aspect, the row decoder can be configured to activate the selected word line in response to the received memory access request when the corresponding access address selects the selected word line and the corresponding parity bit correctly provides parity for the address value of the corresponding access address, and not activate the selected word line in response to the received memory access request when the corresponding parity bit incorrectly provides the parity for the address value of the corresponding access address.

In another aspect, for each row, the row decoder can further comprise corresponding decoder logic (e.g. 312, 352, 352, etc.) coupled to the plurality of address lines and the parity line and configured to provide a select indicator, wherein the select indicator is asserted when an access address addresses the row and a parity bit corresponding to the access address indicates correct parity for an address value of the access address; a corresponding first latch (e.g. 310, 350, 350) coupled to the corresponding decoder logic to latch the select indicator; and a corresponding second latch coupled to the corresponding decoder logic to latch the select indicator, wherein the corresponding word line of the row is activated when the select indicator is asserted and values latched by the first and second latch match.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Further, although the disclosure is described herein with reference to specific embodiments, various modifications and changes can be made without departing from the scope of the present disclosure as set forth in the claims below. For example, parity bits can be used on a column decode circuit 212 (FIG. 2) similar to the way they are used for the row decoder 204 described herein. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A data processing system comprising:
a memory configured to receive memory access requests, each memory access request having a corresponding access address and having a corresponding parity bit for an address value of the corresponding access address, wherein the corresponding access address is received over a plurality of address lines and the parity bit is received over a parity line, the memory having:
a memory array having a plurality of memory cells arranged in rows, each row having a corresponding word line of a plurality of word lines; and
a row decoder coupled to the plurality of address lines, the parity line, and the plurality of word lines, and configured to selectively activate a selected word line of the plurality of word lines based on the corresponding access address and the corresponding parity bit of a received memory access request, wherein the row decoder comprises a plurality of pull-down transistors, wherein a control electrode of each pull-down transistors is coupled to a corresponding word line of the plurality of word lines, wherein a pull-down transistor of the plurality of pull-down transistors is activated when the corresponding word line is activated.

2. The data processing system of claim 1, wherein the row decoder is configured to:
activate the selected word line when the corresponding access address selects the selected word line and the corresponding parity bit correctly provides parity for the address value of the corresponding access address, and
not activate the selected word line when the corresponding parity bit incorrectly provides the parity for the address value of the corresponding access address.

3. The data processing system of claim 1, wherein the memory further comprises:
parity error circuitry coupled to the plurality of address lines and the parity line, and configured to provide a parity error indicator which indicates if the address value of the corresponding access address has a parity error or not.

4. The data processing system of claim 1, wherein the plurality of pull-down transistors are coupled in parallel between an output node and ground, wherein when at least one word line is activated for a memory access to the memory, the output node is pulled to ground to indicate that at least one word line is activated, and when no word lines are activated for the memory access, the output node is not pulled to ground to indicate an error in which no word line is selected in response to the memory access.

5. A data processing system
a memory configured to receive memory access requests, each memory access request having a corresponding access address and having a corresponding parity bit for an address value of the corresponding access address, wherein the corresponding access address is received over a plurality of address lines and the parity bit is received over a parity line, the memory having:
a memory array having a plurality of memory cells arranged in rows, each row having a corresponding word line of a plurality of word lines;
a row decoder coupled to the plurality of address lines, the parity line, and the plurality of word lines, and configured to selectively activate a selected word line of the plurality of word lines based on the corresponding access address and the corresponding parity bit of a received memory access request; and
parity error circuitry coupled to the plurality of address lines and the parity line, and configured to provide a parity error indicator which indicates if the address value of the corresponding access address has a parity error or not, wherein, for each row, the parity error circuitry comprises:
a corresponding pull-down transistor; and
corresponding parity error logic coupled to the plurality of address lines and the parity line and having an output coupled to a control electrode of the corresponding pull-down transistor, wherein the corresponding parity error logic is configured to activate the corresponding pull-down transistor when a parity error exists for a memory access to the row, and not activate the pull-down transistor when parity is correct for the memory access to the row.

6. The data processing system of claim 5, wherein, for each row, the corresponding parity error logic is configured to determine whether or not the parity error exists by using the values on the plurality of address lines and the parity line provided for the memory access to the row.

7. The data processing system of claim 5, wherein the pull-down transistors for the plurality of rows are coupled in parallel, such that when the pull-down transistor for at least one row of the plurality of rows is activated, the parity error circuitry indicates the parity error.

8. A data processing system
a memory configured to receive memory access requests, each memory access request having a corresponding access address and having a corresponding parity bit for an address value of the corresponding access address, wherein the corresponding access address is received over a plurality of address lines and the parity bit is received over a parity line, the memory having:
a memory array having a plurality of memory cells arranged in rows, each row having a corresponding word line of a plurality of word lines; and
a row decoder coupled to the plurality of address lines, the parity line, and the plurality of word lines, and configured to selectively activate a selected word line of the plurality of word lines based on the corresponding access address and the corresponding parity bit of a received memory access request,
wherein, for each row, the row decoder comprises:
corresponding decoder logic coupled to the plurality of address lines and the parity line and configured to provide a select indicator, wherein the select indicator is asserted when an access address addresses the row and a parity bit corresponding to the access address indicates correct parity for an address value of the access address; and
a corresponding first latch coupled to the corresponding decoder logic to latch the select indicator, wherein the corresponding word line of the row is activated when at least the latched select indicator is asserted.

9. The data processing system of claim 8, wherein, for each row, the row decoder further comprises:
a corresponding second latch coupled to the corresponding decoder logic to latch the select indicator, wherein the corresponding word line of the row is activated when the select indicator is asserted and values latched by the first and second latch match.

10. The data processing system of claim 9, wherein, for each row, the row decoder comprises:
a corresponding pull-down transistor having a current electrode coupled to the corresponding word line of the row, wherein the row decoder is configured to activate the pull-down transistor when the corresponding word line of the row is activated,
wherein the corresponding pull-down transistors are coupled in parallel to a pre-charged output node, wherein when at least one word line is activated for a memory access to the memory, the output node is discharged by at least one corresponding pull-down transistor, and when no word lines are activated for the memory access, the output node remains charged to indicate an error in which no word line is selected in response to the memory access.

11. A data processing system comprising:
a system interconnect;
an initiator configured to provide memory access requests to the memory via the system interconnect;
a memory configured to receive the memory access requests, each memory access request having a corresponding access address and having a corresponding parity bit for an address value of the corresponding access address, wherein the corresponding access address is received over a plurality of address lines and the parity bit is received over a parity line, the memory having:
a memory array having a plurality of memory cells arranged in rows, each row having a corresponding word line of a plurality of word lines;
a row decoder coupled to the plurality of address lines, the parity line, and the plurality of word lines, and configured to selectively activate a selected word line of the plurality of word lines based on the corresponding access address and the corresponding parity bit of a received memory access request.

12. In a memory, a method comprising:
receiving an access address for a memory access and a corresponding parity bit for an address value of the access address, wherein the access address indicates a selected word line of the memory; and
activating the selected word line when the corresponding parity bit indicates correct parity for the address value of the access address but not activating the selected word line when the corresponding parity bit indicates incorrect parity for the address value of the access address.

13. The method of claim 12, further comprising:
providing an error indicator if no word lines of the memory are activated in response to receiving the access address.

14. The method of claim 12, further comprising:
providing a parity error if the corresponding parity bit indicates incorrect parity for the address value of the access address.

15. A data processing system comprising:
a memory configured to receive memory access requests, each memory access request having a corresponding access address and having a corresponding parity bit for an address value of the corresponding access address, wherein the corresponding access address is received over a plurality of address lines and the parity bit is received over a parity line, the memory having:
a memory array having a plurality of memory cells arranged in rows, each row having a corresponding word line of a plurality of word lines; and
a row decoder coupled to the plurality of address lines, the parity line, and the plurality of word lines, and configured to selectively activate a selected word line of the plurality of word lines based on the corresponding access address and the corresponding parity bit of a received memory access request,
wherein, for each row, the row decoder includes corresponding parity error logic configured to determine whether or not a parity error exists based on the values on the plurality of address lines and the parity line provided for a memory access to the row.

16. The data processing system of claim 15, wherein, for each row, the row decoder further comprises:
a first corresponding pull-down transistor, wherein the corresponding parity error logic has an output coupled to a control electrode of the first corresponding pull-down transistor, wherein the corresponding parity error logic is configured to activate the corresponding pull-down transistor when the parity error exists for the memory access to the row, and not active the pull-down transistor when parity is correct for the memory access to the row; and
a second corresponding pull-down transistor, wherein a control electrode of the second corresponding pull-down transistor is coupled to the corresponding word line of the row, wherein the second corresponding pull-down transistor is activated when the corresponding word line of the row is activated for the memory access.

17. The data processing system of claim 16, wherein the second corresponding pull-down transistors are coupled in parallel to a pre-charged output node, wherein when at least one word line is activated for the memory access, the output node is discharged by at least one corresponding pull-down transistor, and when no word lines are activated for the memory access, the output node remains charged to indicate an error in which no word line is selected in response to the memory access.

18. The data processing system of claim 15, wherein the row decoder is configured to:
activate the selected word line in response to the received memory access request when the corresponding access address selects the selected word line and the corresponding parity bit correctly provides parity for the address value of the corresponding access address, and not activate the selected word line in response to the received memory access request when the corresponding parity bit incorrectly provides the parity for the address value of the corresponding access address.

19. The data processing system of claim 15, wherein, for each row, the row decoder further comprises:
corresponding decoder logic coupled to the plurality of address lines and the parity line and configured to provide a select indicator, wherein the select indicator is asserted when an access address addresses the row and a parity bit corresponding to the access address indicates correct parity for an address value of the access address;
a corresponding first latch coupled to the corresponding decoder logic to latch the select indicator; and
a corresponding second latch coupled to the corresponding decoder logic to latch the select indicator, wherein the corresponding word line of the row is activated when the select indicator is asserted and values latched by the first and second latch match.

\* \* \* \* \*